United States Patent
Barth et al.

(10) Patent No.: US 8,148,257 B1
(45) Date of Patent: Apr. 3, 2012

(54) SEMICONDUCTOR STRUCTURE AND METHOD FOR MAKING SAME

(75) Inventors: Hans-Joachim Barth, Munich (DE); Gottfried Beer, Nittendorf (DE); Joern Plagmann, Munich (DE); Jens Pohl, Bernhardswald (DE); Werner Robl, Regensburg (DE); Rainer Steiner, Regensburg (DE); Mathias Vaupel, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/894,190

(22) Filed: Sep. 30, 2010

(51) Int. Cl.
*H01L 21/44* (2006.01)
*H01L 21/4763* (2006.01)
*H01L 21/469* (2006.01)

(52) U.S. Cl. ........ 438/614; 438/618; 438/622; 438/627; 438/637; 438/639; 257/E21.575; 257/E21.577; 257/E21.585; 257/E21.586

(58) Field of Classification Search ........... 257/E21.575, 257/E21.577, E21.585, E21.586
See application file for complete search history.

(56) References Cited

U.S. PATENT DOCUMENTS

| | | | | |
|---|---|---|---|---|
| 6,136,695 | A  * | 10/2000 | Lee et al. | 438/637 |
| 6,534,863 | B2 | 3/2003 | Walker et al. | |
| 6,724,087 | B1 * | 4/2004 | Buynoski et al. | 257/762 |
| 7,144,490 | B2 * | 12/2006 | Cheng et al. | 205/118 |
| 7,939,948 | B2 * | 5/2011 | Tang et al. | 257/781 |
| 7,973,411 | B2 * | 7/2011 | Borthakur | 257/762 |
| 2007/0252277 | A1 * | 11/2007 | Tsao et al. | 257/751 |
| 2009/0029108 | A1 * | 1/2009 | Barth et al. | 428/156 |

* cited by examiner

*Primary Examiner* — Mohsen Ahmadi
(74) *Attorney, Agent, or Firm* — Infineon Techn AG; Philip H. Schlazer

(57) ABSTRACT

One or more embodiments relate to a method of forming an electronic device, comprising: providing a workpiece; forming a first barrier layer over the workpiece; forming an intermediate conductive layer over the first barrier layer; forming a second barrier layer over the intermediate conductive layer; forming a seed layer over the second barrier layer; removing a portion of the seed layer to leave a remaining portion of the seed layer and to expose a portion of the second barrier layer; and electroplating a fill layer on the remaining portion of the seed layer.

6 Claims, 13 Drawing Sheets

US 8,148,257 B1

SEMICONDUCTOR STRUCTURE AND METHOD FOR MAKING SAME

TECHNICAL FIELD

One or more embodiments relate to relate to semiconductor structures and methods for making semiconductor structures.

BACKGROUND

Conventional damascene or dual-damascene electroplating of large structures (e.g. pads, conductive lines, vias in the upper metallization levels, in redistribution layers on top of passivation or in fan-in and fan-out wafer level packaging concepts) may suffer from a thick overburden of the plated metal on planar surfaces outside of the damascene feature. This heavy metal overburden leads to long plating times and especially to extremely long chemical mechanical polishing (CMP) or etching times to remove and planarize the metal overburden on the planar surfaces. These long CMP or etching times may make the process very expensive and unfavorable for volume manufacturing.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become clear better understood by reference to the following detailed description. The elements of the drawings are not necessarily to scale relative to each other.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
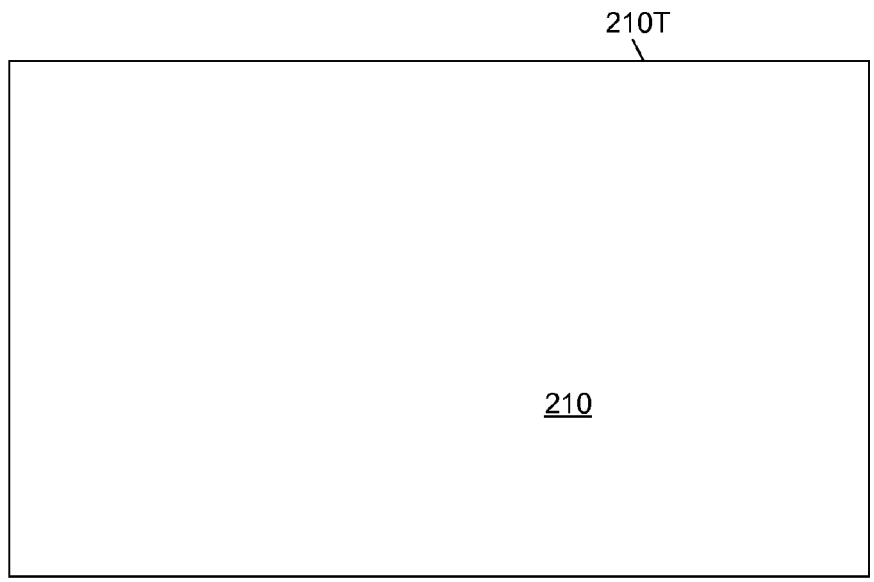
FIGS. 1 through 9 show a method for manufacturing a structure (for example, a semiconductor structure) in accordance with an embodiment of the present invention.

FIG. 1 shows a workpiece 210 which may, for example, be part of or may include an electronic device such as a semiconductor device. An electronic device may be a semiconductor structure. The workpiece 210 may be part of or may include a semiconductor structure. The workpiece 210 may, for example, be part of or may include a semiconductor chip and/or integrated circuit. The semiconductor chip may include an integrated circuit.

The workpiece 210 includes a top surface 210T. In one or more embodiments, the workpiece 210 may be homogenous. However, in one or more embodiments, the workpiece 210 may comprise a plurality of layers of different materials. The workpiece 210 may, for example, include a dielectric material. The workpiece 210 may, for example, be a dielectric layer. The workpiece 210 may, for example, include a dielectric layer.

The workpiece 210 may include a semiconductor substrate with electronic devices (e.g. semiconductor devices) and a multilevel interconnect architecture on top of the semiconductor substrate. The semiconductor substrate may comprise bulk silicon, a bulk silicon wafer, silicon on insulator (SOI), a silicon on insulator wafer, silicon carbide (SiC), silicon carbide wafers, germanium (Ge), germanium wafers, gallium arsenide (GaAS), a gallium arsenide wafer or other III/V materials and III/V wafers. The workpiece may comprise an embedded waferlevel ball grid array (eWLB) artificial wafer or panel. The workpiece may comprise a silicon interposer or silicon substrate or alternatively an organic substrate or glass substrate. The workpiece may comprise a printed circuit board (PCB) or laminate panel. The workpiece may comprise a photo-voltaic panel. The workpiece may be built out of a single layer or out of a multitude of layers of different materials.

The workpiece includes a top surface 210T. The top surface 210T may comprise an insulating material, a semiconductive material, a conductive material or combinations and mixtures thereof.

Figure 2:
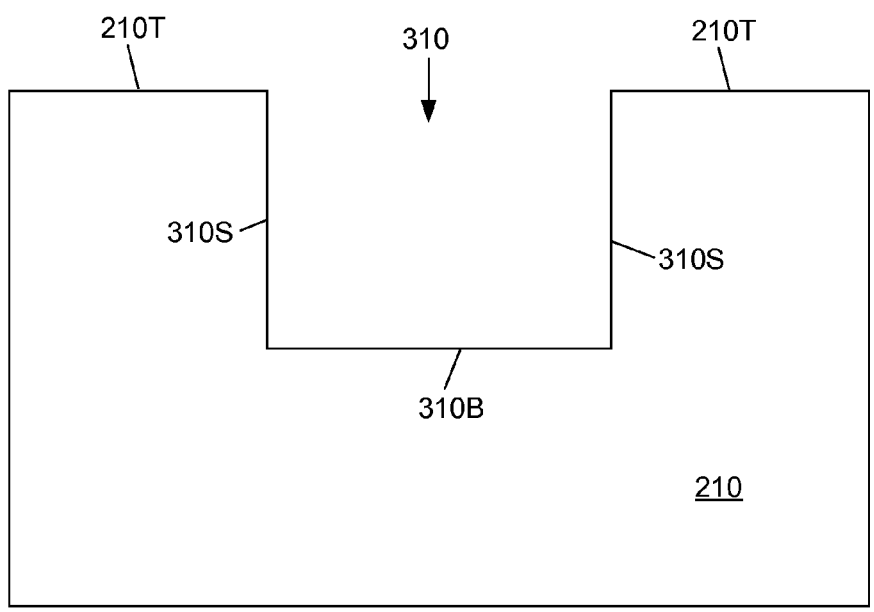

Referring to FIG. 2, an opening 310 may be formed within the workpiece 210 so as to form a workpiece 310 that includes an opening 310. Generally, the opening 310 may be any type of opening. The opening 310 may be a trench or a hole. The opening 310 may have any cross sectional shape. It is understood that the opening 310 may be formed in any way. In one or more embodiments, the opening 310 may be formed by an etch process (such as a dry etch process).

In one or more embodiments, the opening 310 may have a width of about 1 μm (micron) or greater. In one or more embodiments, the opening 310 may have a width of about 1.5

μm (microns) or greater. In one or more embodiments, the opening 310 may have a width of about 2 μm (microns) or greater.

In one or more embodiments, the opening 310 may have a minimum width of about 1 μm (micron) or greater. In one or more embodiments, the opening 310 may have a minimum width of about 1.5 μm (microns) or greater. In one or more embodiments, the opening 310 may have a minimum width of about 2 μm (microns) or greater.

Referring to FIG. 2, the opening 310 may include a bottom surface 310B. The opening 310 may further include one or more sidewall surfaces 310S. In one or more embodiments, the sidewall surfaces 310S may be substantially vertical. However, in other embodiments, the sidewall surfaces may have other shapes such as, for example, sloped, tilted or even step-shaped.

In the embodiment shown in FIG. 2, the opening 310 is formed with the workpiece 210. In one or more embodiments, an opening that is formed within a workpiece may not go through the workpiece 210. However, in another embodiment, an opening forming within a workpiece may be formed which goes through the workpiece 210 (for example, from a top surface to a bottom surface).

In some embodiments, the opening 310 may be a single damascene opening. However, in some embodiments, the opening 310 may be replaced with a multi-damascene opening such as a dual-damascene opening. The opening 310 may be formed by one or more masking steps. In some embodiments, an opening may be formed using two or more masking steps. Hence, the present invention is applicable to all type openings.

Figure 3:
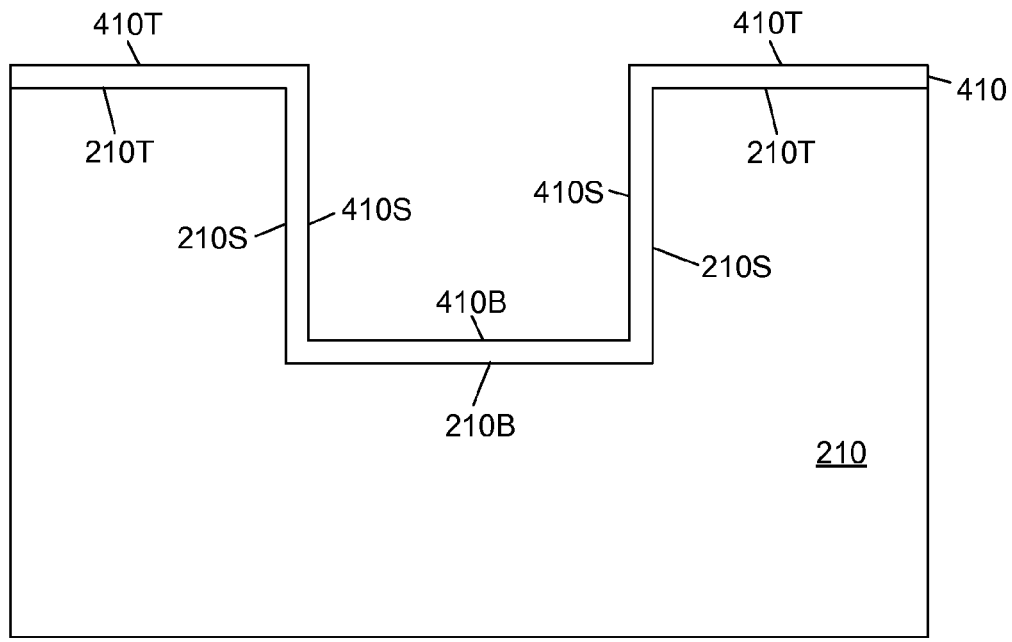

Referring to FIG. 3, a first barrier layer 410 may be formed over the workpiece 210 so that the first barrier layer 410 may be formed over the top surface 210T and within the opening 310. The first barrier layer 410 may be formed over the top surface 210T of the workpiece 210 as well as over the sidewall surfaces 310S and bottom surface 310B of the opening 310. In one or more embodiments, the first barrier layer 410 may be formed on (and in direct contact with) the workpiece 210 such that the first barrier layer 410 may be formed on (and in direct contact with) the top surface 410T as well as on (and in direct contact with) the bottom surface 210B and the one or more sidewall surfaces 410S of the opening 310.

The first barrier layer 410 may be formed by a deposition and/or growth process. The deposition process of the first barrier layer may be a substantially conformal deposition. However, a non-conformal but continuous and uninterrupted deposition of the layer may be feasible as well. The first barrier layer 410 may be deposited using a chemical vapor deposition process (CVD), a physical vapor deposition process (PVD) and/or a sputtering process. The first barrier layer 410 may itself include a stack of two or more layers of different materials. The first barrier layer 410 may include a top surface 410T, one or more sidewall surfaces 410S and a bottom surface 410B.

Figure 4:
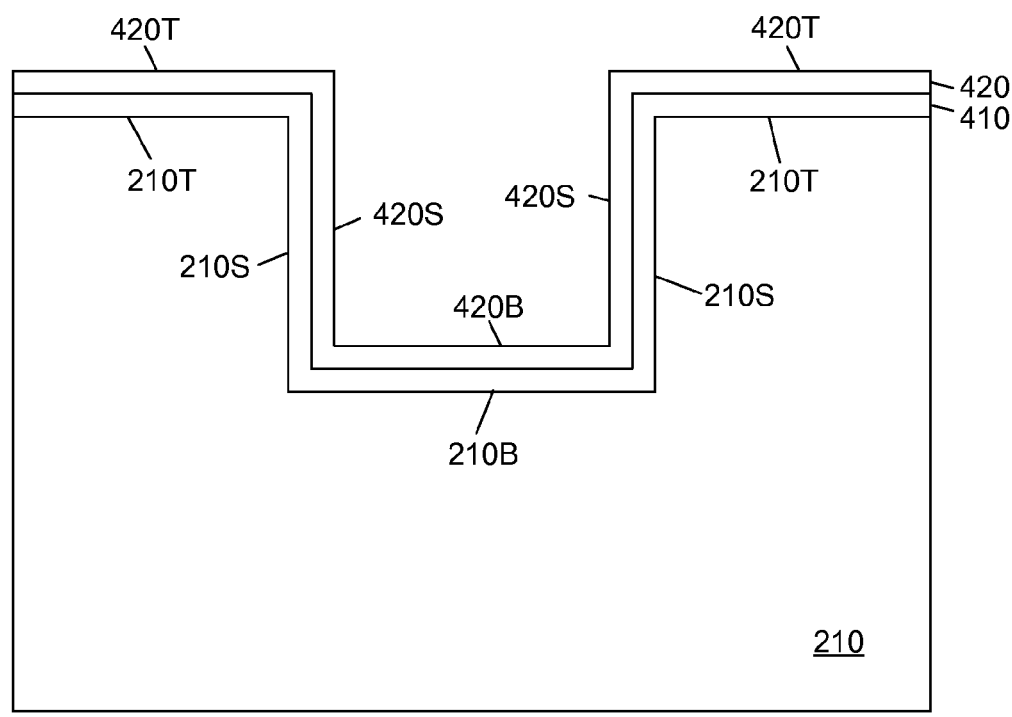

Referring to FIG. 4, an intermediate conductive layer 420 may then be formed over the first barrier layer 410. The intermediate conductive layer 420 may be formed over the top surface 410T of the first barrier layer 410 as well as over the sidewall surfaces 410S and the bottom surface 410B of the first barrier layer 410. The intermediate conductive layer 420 may be formed within the opening 310 as well as outside the opening 310. The intermediate conductive layer may be formed by a deposition and/or growth process. The deposition process of the intermediate conductive layer 420 may be a substantially conformal deposition. However, a non-conformal but continuous and uninterrupted deposition of the layer may be feasible as well. The deposition process may include a chemical vapor deposition process, a physical vapor deposition process and/or a sputter process. The intermediate conductive layer 420 includes a top surface 420T, one or more sidewall surfaces 420S and a bottom surface 420B as shown in FIG. 4.

In one or more embodiments, the intermediate conductive layer 420 may be formed directly on the first barrier layer 410.

Figure 5:
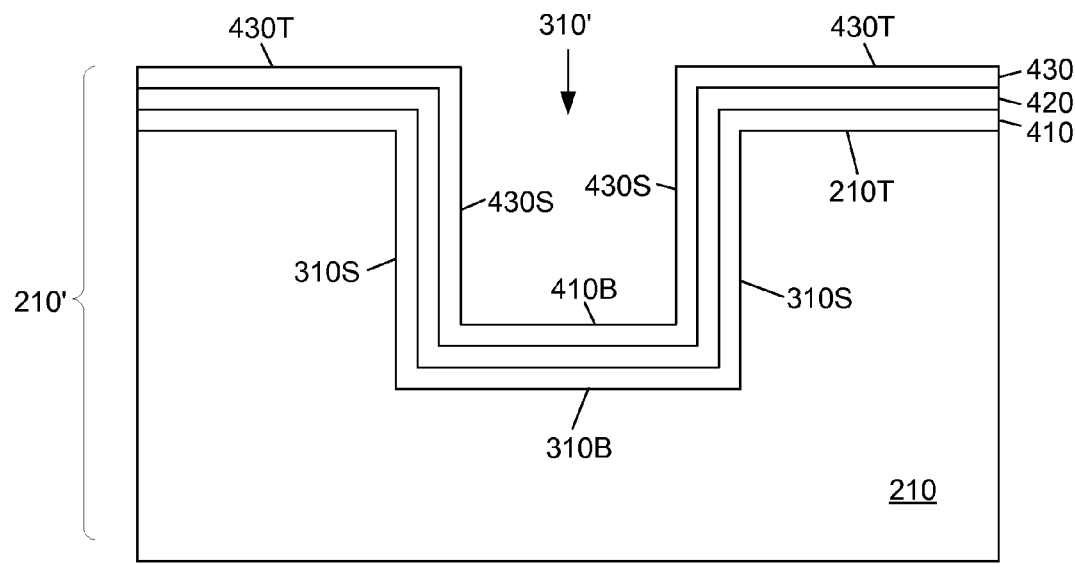

Referring to FIG. 5, a second barrier layer 430 may then be formed over the intermediate conductive layer 420. The second barrier layer 430 may be formed over the top surface 420T, the sidewall surfaces 420S and the bottom surface 420B of the intermediate conductive layer 420. The second barrier layer 430 may be formed within the opening 310 and as well as outside the opening 310. The second barrier layer 430 may be formed by a deposition and/or growth process. The deposition process of the second barrier layer 430 may be a substantially conformal deposition. However, a non-conformal but continuous and uninterrupted deposition of the layer may be feasible as well. The deposition process may include a chemical vapor deposition, a physical vapor deposition and/or a sputtering process. The second barrier layer 430 includes a top surface 430T, one or more sidewall surfaces 430S and a bottom surface 430B.

In one or more embodiments, the second barrier layer 430 may be formed in directly on the intermediate conductive layer 420.

Referring to FIG. 5, as a result of forming the layers 410, 420 and 430 over the workpiece 210, a structure 210' is formed which may be used for the formation (e.g. deposition and/or growth) of one or more additional layers. The structure 210' includes the workpiece 210 as well as the layers 410, 420 and 430. The structure 210' includes a top surface 430T. The structure 210' includes an opening 310' having one or more sidewall surfaces 430S as well as a bottom surface 430B.

Figure 6:
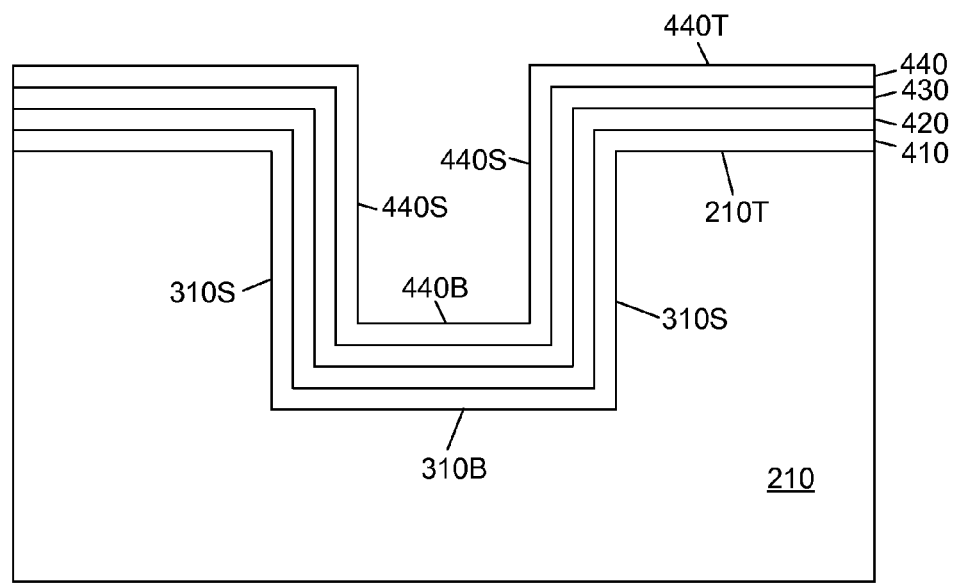

Referring to FIG. 6, a seed layer 440 may then be formed over the second barrier layer 430. The seed layer 440 may be formed over the top surface 430T, the sidewall surfaces 430S and the bottom surface 430B of the second barrier layer 430. The seed layer 440 may be formed within the opening 310 and as well as outside the opening 310. The formation process may include a deposition process and/or growth process. The deposition the seed layer 440 may be a substantially conformal deposition. However, a non-conformal but continuous and uninterrupted deposition of the layer may be feasible as well. The deposition process may include a chemical vapor deposition, a physical vapor deposition and/or a sputtering process. The seed layer 440 includes a top surface 440T, one or more sidewall surfaces 440S and a bottom surface 440B.

In one or more embodiments, the seed layer 440 may be formed directly on the second barrier layer 430.

From the perspective of opening 310', the seed layer 440 may be viewed as be formed within the opening 310' as well as outside the opening 310'.

Figure 7:
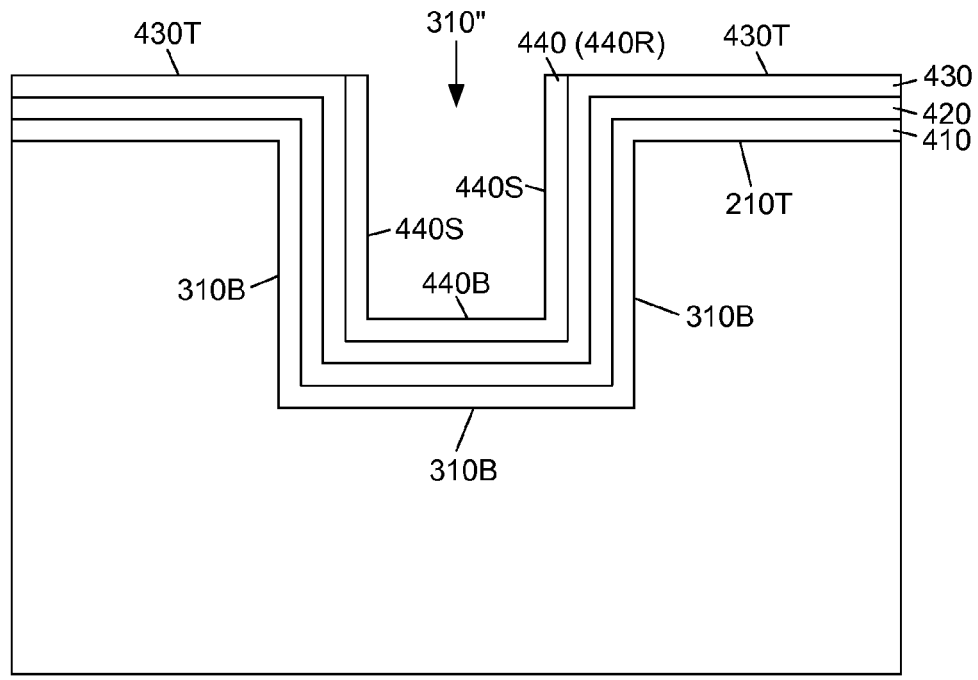

Referring to FIG. 7, a portion of the seed layer 440 may then be removed (for example, selectively removed). The seed layer 440 may, for example, be removed from at least the top surface 430T of the second barrier layer 430. In one or more embodiments, it is possible that the seed layer 440 also be removed from at least a portion of the sidewall surfaces of the second barrier layer 430. For example, in one or more embodiments, it is possible that the seed layer 440 also be removed from a portion of the sidewall surfaces of the second barrier layer 430. In one or more embodiments, it may also be possible that the seed layer be removed from all (or substantially all) of the sidewall surfaces 430S of the second barrier layer. It is also possible that the seed layer 430 be removed from none (or substantially none) of the sidewall surfaces 430S of the second barrier layer 430. In some embodiments, the amount of seed layer 440 removed from the sidewall surfaces 430S be trace amounts. In some embodiments, it may also be possible that a small amount of seed layer 440 be left on the top surface 430T of the second barrier layer 430.

The removal of a portion of the seed layer 440 may leave a remaining portion 440R of the seed layer 440. In one or more embodiments, the remaining portion 440R of the seed layer 440 may overlie at least a portion of the bottom surface 430B. In one or more embodiments, the remaining portion 440R of the seed layer 440 may overlie substantially all (or all) of the bottom surface 430B. In one or more embodiments, the remaining portion 440R may overlie at least the bottom surface 430B of the second barrier layer 430. In one or more embodiments, the remaining portion 440R may overlie the bottom surface 430B and at least a portion of the sidewall surfaces 430S of the second barrier layer 430. In one or more embodiments, the remaining portion 440R of the seed layer may overlie the bottom surface 430B and all (or substantially all) of the sidewall surfaces 430S of the second barrier layer 430.

In the embodiment shown in FIG. 7, the remaining portion 440R of the seed layer 440 may be at or flush with the top surface 430T of the second barrier layer 430. In some embodiments, it may be possible that the remaining portion 440R of the seed layer 440 be below the top surface 430T. In one or more embodiments, the remaining portion 440R of the seed layer 440 may not go above the top surface 430T. In some embodiments, it may also be possible that a remaining portion 440R of the seed layer 440 overlie a small portion of the top surface 430T.

With respect to opening 310, in one or more embodiments, at least a part of the removed portion of the seed layer is removed from outside of the opening 310. Likewise, in one or more embodiments, at least a part of the remaining portion 440R of seed layer 440 is within the opening 310.

With respect to opening 310', in one or more embodiments, at least a part of the removed portion of the seed layer 440 is removed from outside of the opening 310'. Likewise, in one or more embodiments, at least a part of the remaining portion 440R of seed layer 440 is within the opening 310.

With respect to opening 310', it is seen that, in one or more embodiments, the seed layer 440 may be removed from surfaces outside the opening 310' and be allowed to remain on surfaces inside the opening 310'.

The removal (which may, for example, be a selective removal) of a portion of the seed layer 440 may be accomplished in many different ways. For example, a chemical mechanical polishing process may be used. In another embodiment, the removal may be accomplished using an etching process. The etching process may include a wet etching process and/or a dry etching process. The etching process may include an etch-back process. To accomplish the etching process, it is possible that a sacrificial resist or other sacrificial material may first be applied to protect that portion of the seed layer 440 which is not to be removed (e.g. seed layer portion 440R). In one or more embodiments, the removal of a portion of the seed layer 440 may include a mechanical process. In one or more embodiments, the removal may include a chemical process. In one or more embodiments, the removal may include a mechanical process and a chemical process.

Referring to FIG. 7, the bottom surface 440B and sidewalls surface 440S may define an opening 310".

Figure 8:
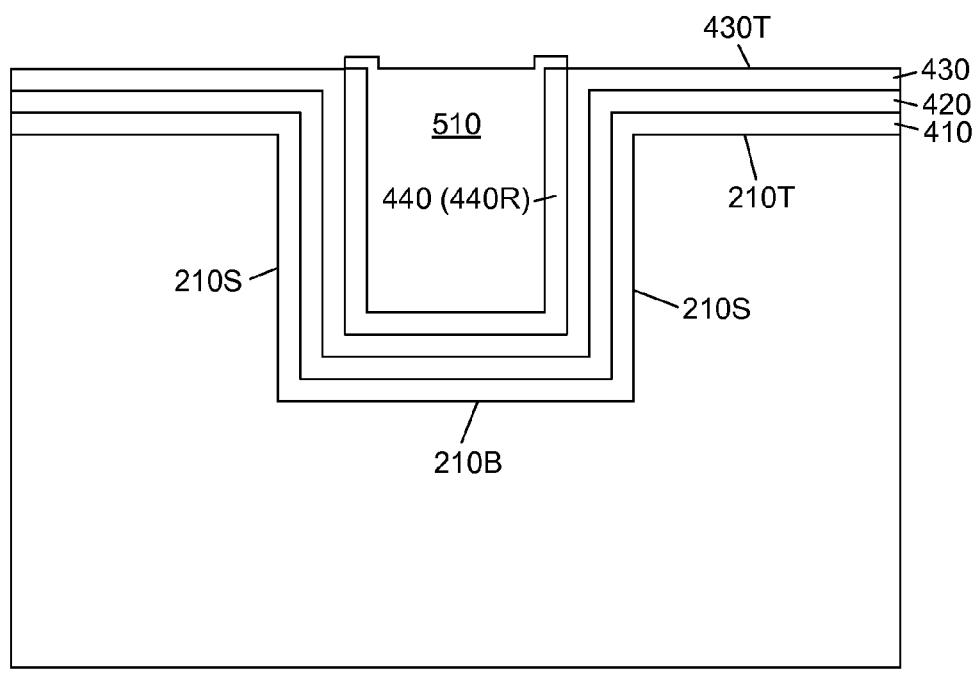

Referring to FIG. 8, a fill layer 510 may be formed over the bottom surface 440B and sidewall surfaces 440S of the remaining portion 440R of seed layer 440. In one or more embodiments, the fill layer 510 may be formed by a deposition and/or growth process. In one or more embodiments, the fill layer 510 may be formed by a deposition process. In one or more embodiments, the deposition process may be a selective deposition process.

In one or more embodiments, it is possible that the fill layer 510 may deposit on the remaining portion 440R of seed layer 440 but substantially none of the fill layer 510 may deposit on the second barrier layer 430.

In one or more embodiments, the deposition process for forming the fill layer 510 may include a process selected from the group consisting of an electroplating process, an electroless plating process, and a chemical vapour deposition (CVD) process.

In one or more embodiments, the deposition process for forming the fill layer 510 may be an electroplating process. In one or more embodiments, the electroplating process may be a selective electroplating process.

In one or more embodiments, the seed layer may serve a seed and/or nucleation and/or activation function.

In one or more embodiments, the deposition process for forming the fill layer 510 may be an electroplating process (e.g. an electrodeposition process). In one or more embodiments, the fill layer 510 may deposit (e.g. electroplate) only on the surfaces of the remaining portion 440R of the seed layer 440 and may not deposit (e.g. electroplate) on the second barrier layer 430. In one or more embodiments, the second barrier layer 430 may include one or more materials which discourage or prevent the deposition (e.g. electroplating) of the fill layer 510 onto the second barrier layer 430.

In one or more embodiments, it is possible that the fill layer 510 may nucleate and grow only on the surfaces of the remaining portion 440R of the seed layer 440 and may not nucleate and grow on the second barrier layer 430.

From the perspective of opening 310, referring to FIG. 8, in some embodiments, the fill layer 510 may at least partially fill the opening 310. In one or more embodiments, the fill layer 510 may fill the opening 310. However, in some embodiments, the fill layer 510 need not fill the opening 310. From the perspective of opening 310", in some embodiments, the fill layer 510 may at least partially fill the opening 310". In one or more embodiments, the fill layer 510 may fill the opening 310". However, in some embodiments, the fill layer 510 need not fill the opening 310". Hence, in some embodiments, the fill layer 510 may be flush with or go above the top surface 430T of the second barrier layer 430. In some embodiments, the fill layer 510 may remain below the top surface 430T of the second barrier layer 430.

Figure 13A:
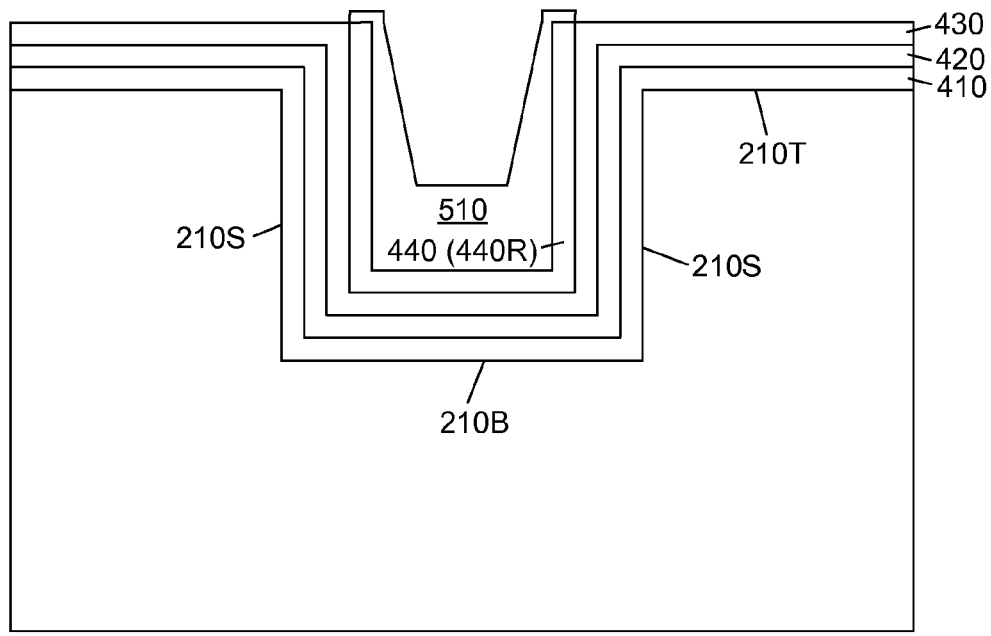
FIGS. 13 through 15 shows a method for making a structure (for example, a semiconductor structure) in accordance with an embodiment of the present invention.
Figure 13B:
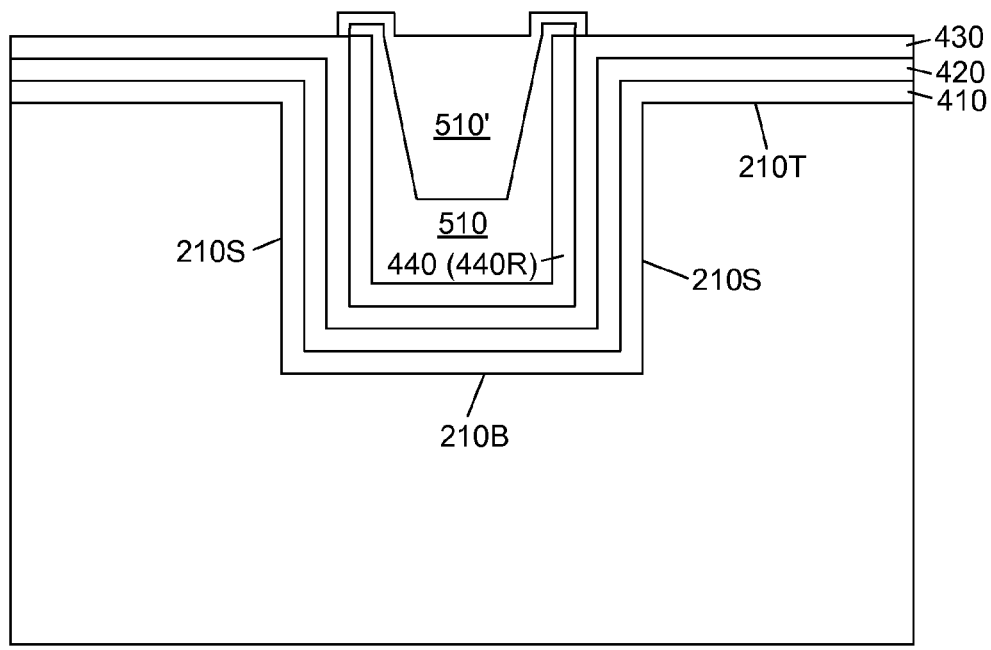

Referring to FIG. 13A, in some embodiments, it is possible that the fill layer 510 only fill a portion of the opening 310. Referring to FIG. 13B, it is also possible that a second electroplating process be performed to electroplate a second fill material 510' onto the fill material 510. From the perspective of opening 310", in some embodiments, it is possible that the fill layer 510 only fill a portion of the opening 310". Referring to FIG. 13B, it is also possible that a second electroplating process be performed to electroplate a second fill material 510' onto the fill material 510.

It is noted that the use of an intermediate conductive layer 420 may provide an advantage when an electroplating method is used to deposit the fill material 510. Referring again to FIG. 8, during an electroplating process used for the deposition of the fill material 510, a voltage may be applied to a peripheral portion of at least one of the layers of the layered stack 410, 420, 430 (e.g. to a peripheral portion away from the opening 310 or away from the surfaces of the remaining portion of the seed layer 440). The layered stack 410, 420, 430 may provide a conductive pathway for the electrical current for the electroplating process. The intermediate conductive layer 420 may be made to have a relatively high electrical conductivity so that voltage drop along the current path may be lower in comparison to a structure incorporating only a single barrier layer without an intermediate conductive layer 420. For example, in some embodiments, the electrical conductivity of the intermediate conductive layer may be greater than the electrical conductivity of either the first or second barrier layers. Hence, the intermediate conductive layer 420 may provide an additional conductive path for the plating current. It may thus be possible that high deposition rates with good thickness uniformity of the fill material be achieved. These high deposition rates will be achieved especially within the opening 310 on the exposed surface of seed layer 440R. On the remaining barrier layer 430T the deposition rate may be about zero or at least very low.

Figure 9:
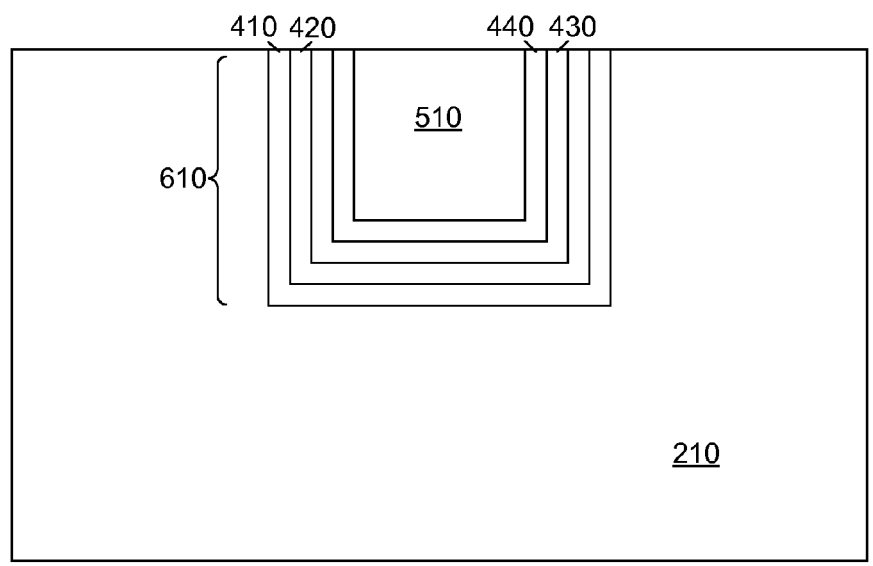

Referring to FIG. 8, portions of the first barrier layer 410, intermediate conductive layer 420, second barrier layer 430, the seed layer 440 and the fill layer 510 may then be removed from the structure shown in FIG. 8 to form the structure shown in FIG. 9. The removal process may include a chemical mechanical polishing process and/or an etching process. The etching process may include a dry etching process and/or a wet etching process. The first barrier layer 410, intermediate conductive layer 420, second barrier layer 430, seed layer 440 and fill layer 510 may be made flush with the top surface 210T of the workpiece 210. The structure shown in FIG. 9 shows a conductive feature 610 disposed in a workpiece 210. In one or more embodiments, the structure shown in FIG. 9 may be a semiconductor structure.

The process for making the conductive feature 610 may include a damascene process such as a single or dual-damascene process.

Referring to FIG. 9, in one or more embodiments, the workpiece 210 may, for example, represent a substrate. A substrate may, for example, be a semiconductor substrate. In one or embodiments, the semiconductor substrate may, for example, be a bulk-semiconductor substrate such as a bulk-silicon substrate. In one or more embodiments, the semiconductor substrate may be an SOI substrate. As an example, an SOI substrate may include a bulk-semiconductor substrate, an insulation layer overlying the bulk-semiconductor substrate, and a semiconductor layer overlying the insulation layer.

The conductive feature 610 may represent a conductive via formed within a substrate. A bottom etching or a backside grinding of the workpiece 210 may be performed so that a bottom surface of the conductive feature 610 is exposed. In this case the conductive feature 610 may represent a through-substrate via.

In one or more embodiments, the workpiece 210 may, for example, comprise a dielectric layer or may comprise a dielectric layer on top of a semiconductor wafer such as a bulk silicon wafer (or SOI wafer) or even comprise a dielectric layer on top of a chip (e.g. a semiconductor chip) wherein the chip includes a multi-level interconnect architecture. The conductive feature 610 may, for example, represent a metal line, a redistribution line or a pad structure. In another embodiment the conductive feature 610 may, for example, represent a conductive via (or conductive contact) formed in the dielectric layer.

In one or more embodiments, the workpiece 210 may be a single homogeneous layer. However, in one or more embodiments, the workpiece 210 may comprise two or more layers of different materials. For example, referring to FIG. 10, the workpiece 210 may comprise a dielectric layer 222 overlying a layer 224. In the embodiment shown in FIG. 10, the conductive feature 610 may be disposed through the dielectric layer 222 and be in direct contact with a top surface of layer 224. In one or more embodiments, the structure shown in FIG. 10 may be a semiconductor structure.

Figure 10:
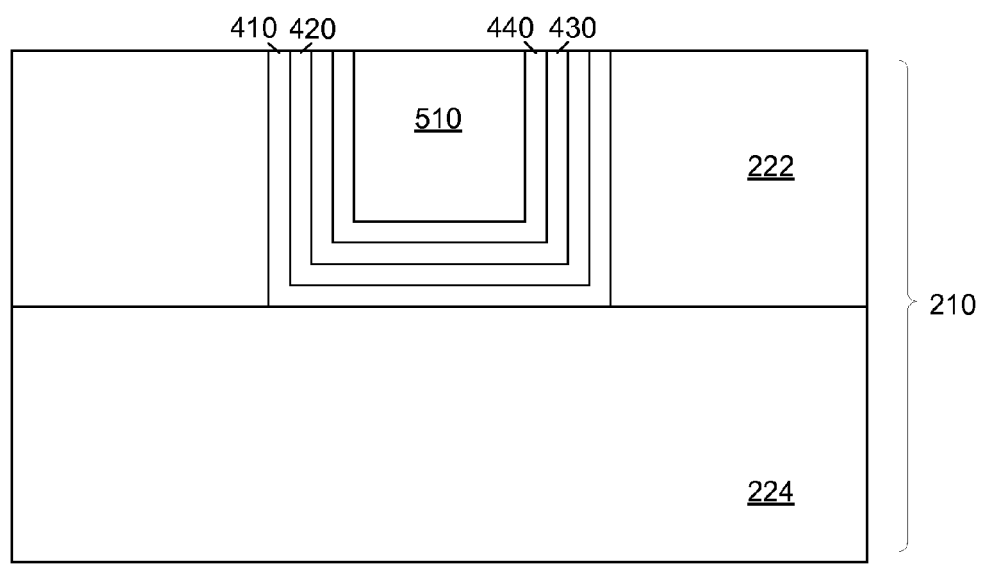
FIG. 10 shows a structure (for example, a semiconductor structure) in accordance with an embodiment of the present invention.

Referring to FIG. 10, the layer 224 may represent a substrate. The conductive feature 610 may represent a conductive via that electrically couples a conductive interconnect (formed, for example, in a metal-1 metallization level above the conductive via 610) to a substrate 224.

A metallization level may include one or more metal lines. A metal line may itself include a pad portion (such as a bond pad, contact pad and/or landing pad). A metallization level may include a plurality of metal lines. Each of the metal lines may be spacedly disposed from each other. In some embodiments, metal lines may be useful for routing electrical signals primarily in a horizontal direction. A metallization level may, for example, be part of a semiconductor device, a semiconductor chip and/or an integrated circuit. A metallization level may be, for example, metal-1, metal-2, metal-3 all the way up to an including a final metallization level.

A conductive via may electrically couple a metallization level to another metallization level. A conductive via may be electrically coupled a metallization level to a substrate. A conductive via that electrically couples a metallization level to a substrate may also be referred to as a conductive contact. In some embodiments, a conductive via may be useful for routing electrical signals primarily in a vertical direction.

Figure 11:
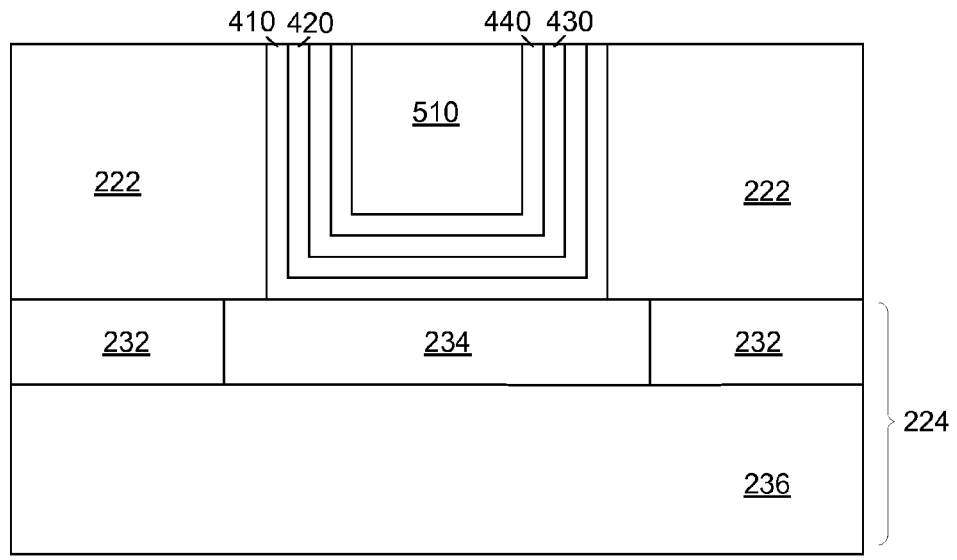
FIG. 11 shows a structure (for example, a semiconductor structure) in accordance with an embodiment of the present invention.

Referring to FIG. 11, it is seen that the layer 224 may comprise a dielectric layer 232 overlying a layer 236. The layer 224 may further comprise a conductive layer 234 disposed in the dielectric layer 232. In one or more embodiments, the conductive layer 234 may represent a metal line belonging to a metallization level.

Still referring to FIG. 11, if the metal line 234 belongs to a metallization level below the final metallization level, then the conductive feature 610 may represent a conductive via which electrically couples a first metallization level to a second metallization level. If the metal line 234 belongs to a final metallization level, the conductive feature 610 may represent a conductive pad or an underbump metallization disposed over a metal line of a final metallization level. It is possible that the conductive feature 610 may itself represent a conductive (e.g. metallic) bump.

Figure 12:
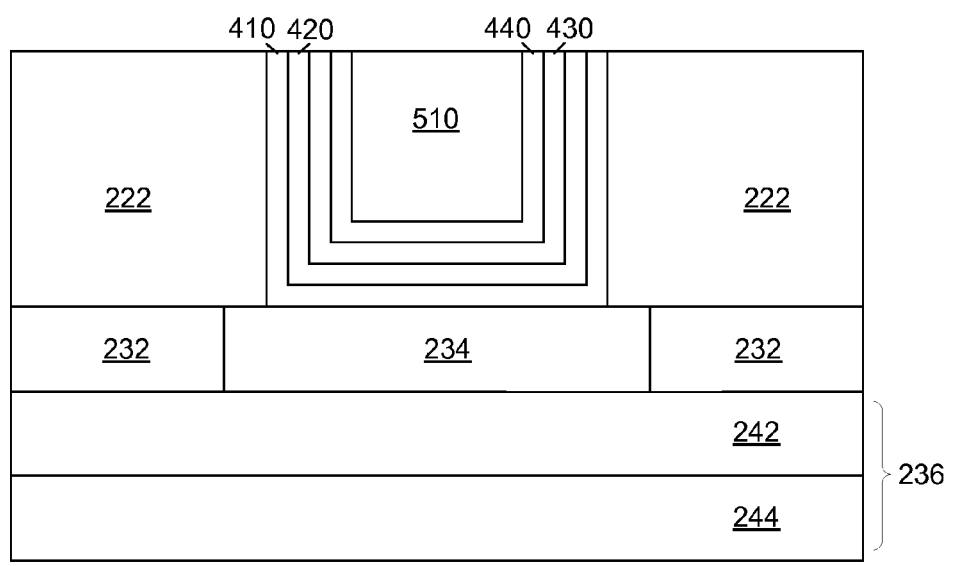
FIG. 12 shows a structure (for example, a semiconductor structure) in accordance with an embodiment of the present invention.

Referring to FIG. 12, it is seen that the layer 236 may represent a layer 242 overlying a substrate 244 (for example, a semiconductor substrate). The layer 242 may itself include one or more dielectric layers as well as one or more metallization levels.

Figure 14:
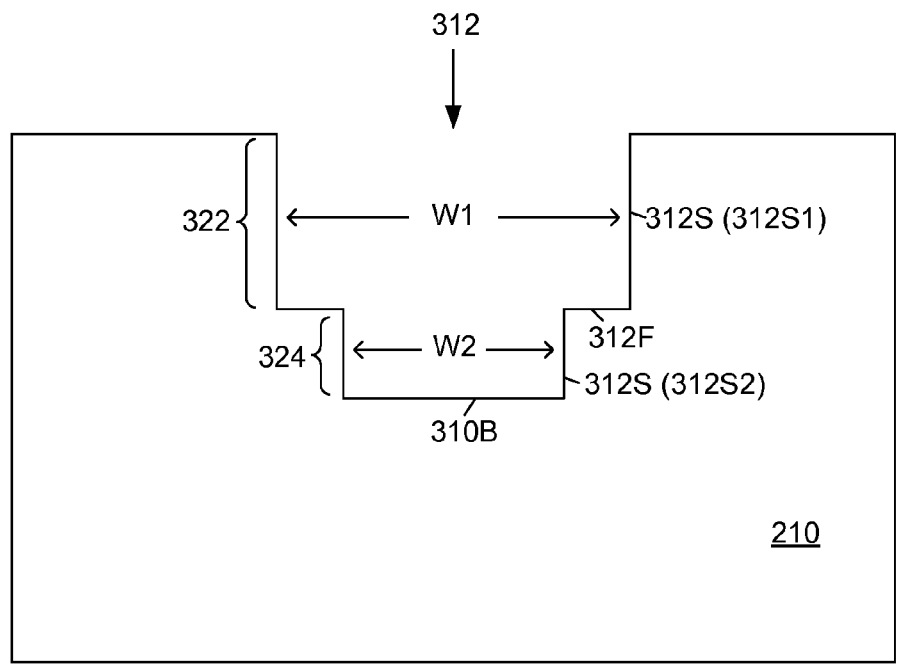

FIG. 14 shows another embodiment, wherein an opening 312 is formed within a workpiece 210. The opening 312 may be a dual-damascene opening. In some embodiments, the opening 312 may be formed using two or more masking steps. The opening 312 may include a bottom surface 312B and sidewall surfaces 312S. The opening 312 includes a floor 312F.

Referring to FIG. 14, it is seen that the opening 312 includes an upper portion 322 and a lower portion 324. The upper portion 322 may itself be a trench or a hole having sidewall surfaces 312S (312S1) and bottom surface 312F. The lower portion 324 may be a trench or a hole having sidewall surfaces 312S (312S2) and bottom surface 312B. In one or more embodiments, the upper portion 322 may be useful for the formation of a metal line which is part of a metallization level. In one or more embodiments, the lower portion 324 may be useful for the formation of a conductive via coupling a metallization level to another metallization level or for coupling a metallization level to a substrate.

In one or more embodiments, the upper portion 322 of opening 312 may have a width of W1 while the lower portion 324 of opening 312 may have a width of W2. The width W1 may be greater than the width W2. The width of the entire opening 312 may be W1. The minimum width of the entire opening 312 may be W2.

In one or more embodiments, the entire opening 312 may have a width of about 1 μm (micron) or greater. In one or more embodiments, the opening 312 may have a width of about 1.5 μm (microns) or greater. In one or more embodiments, the opening 312 may have a width of about 2 μm (microns) or greater.

In one or more embodiments, the entire opening 312 may have a minimum width of about 1 μm (micron) or greater. In one or more embodiments, the opening 312 may have a minimum width of about 1.5 μm (microns) or greater. In one or more embodiments, the opening 312 may have a minimum width of about 2 μm (microns) or greater.

Figure 15:
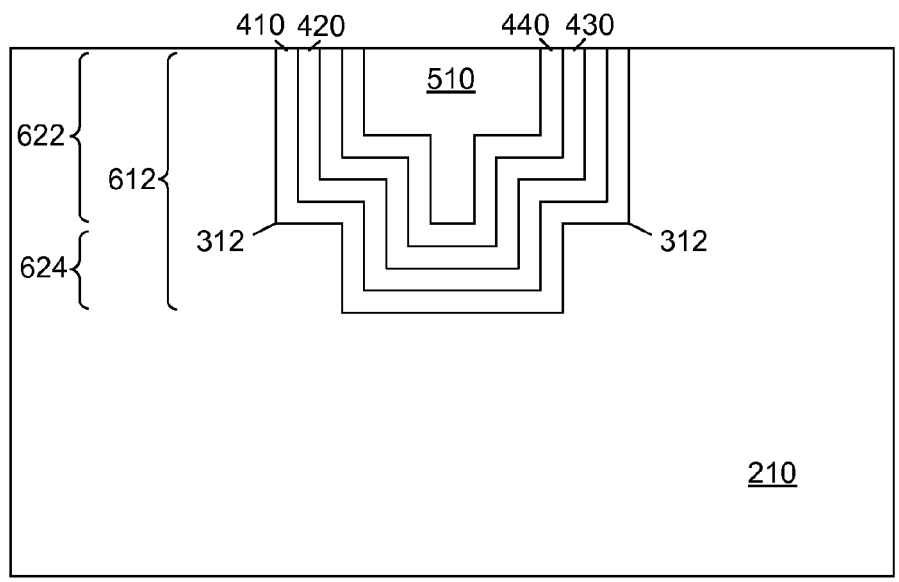

FIG. 15, shows a conductive feature 612 which is also an embodiment of the invention. The conductive feature 612 of FIG. 15 is formed in the opening 312. The conductive feature 612 shown in FIG. 15 includes an upper portion 622 and a lower portion 624. The upper portion 622 may be wider than the lower portion 624.

The conductive feature 612 shown in FIG. 15 may be formed using a process similar to that described above with respect to FIGS. 1 through 9. Hence, similar process steps may be followed except that the opening 310 shown in FIG. 1 is replaced with the opening 312 shown in FIG. 14. The process for making the conductive feature 612 may include a damascene process such as a dual-damascene process.

The opening 312 shown in FIG. 14 may be replaced still further with an opening having a triple-tiered opening (e.g. a tripled damascene) and this may be continued to any multi-tiered opening.

The conductive feature 612 includes a first barrier layer 410, an intermediate conductive layer 420, a second barrier layer 430, a seed layer 440 and a fill layer 510.

Figure 16:
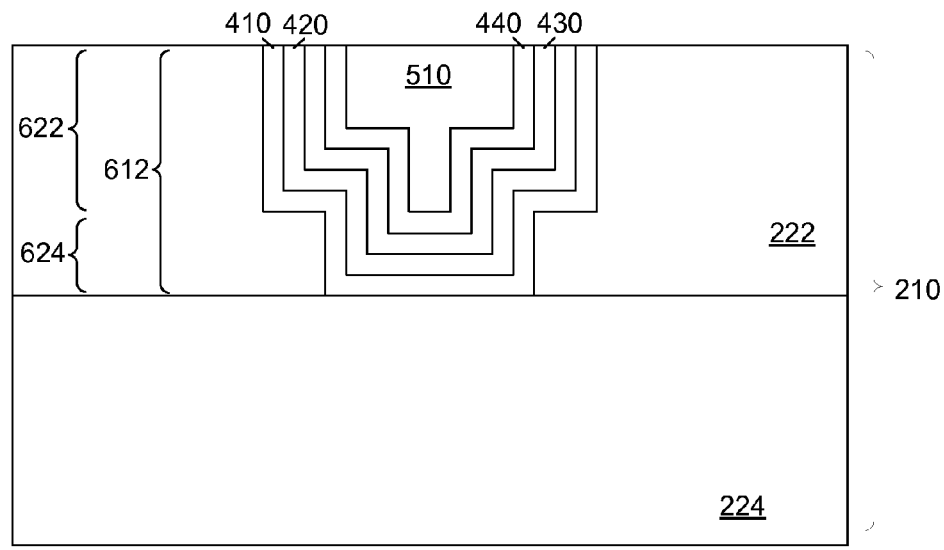
FIG. 16 shows a structure (for example, a semiconductor structure) in accordance with an embodiment of the present invention.

Referring to FIG. 16, the workpiece 210 includes a dielectric layer 222 disposed over a layer 224. In one or more embodiments, the layer 224 may represent a substrate. In this case, the upper portion 622 may represent a metal line of a metallization level (such as metal-1) while the lower portion 624 may represent a conductive via (e.g. conductive contact) coupling the metal line 622 to the substrate 224.

Figure 17:
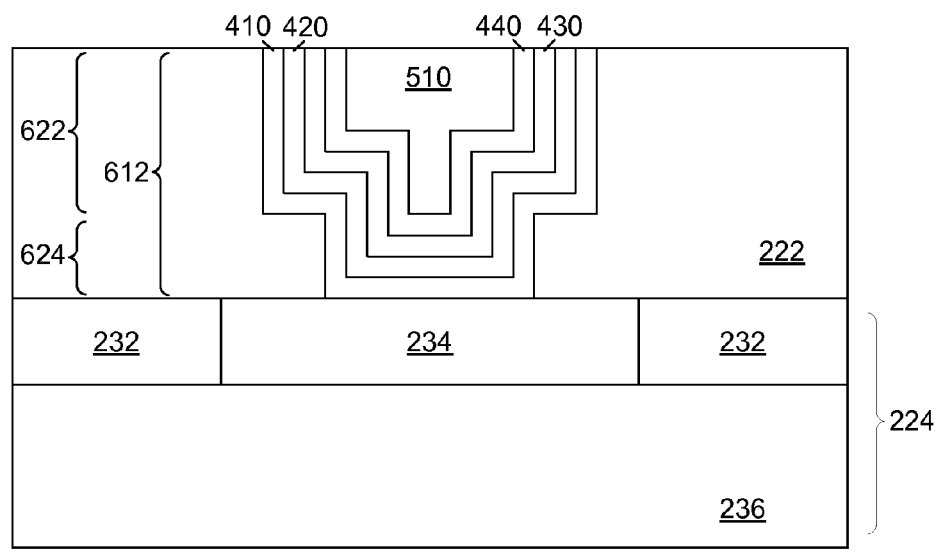
FIG. 17 shows a structure (for example, a semiconductor structure) in accordance with an embodiment of the present invention.

Referring to FIG. 17, the workpiece 224 may comprise a dielectric layer 232 overlying a layer 236. A conductive layer 234 is disposed within the dielectric layer 232. The conductive layer 234 may represent a metal line of a metallization layer.

Figure 18:
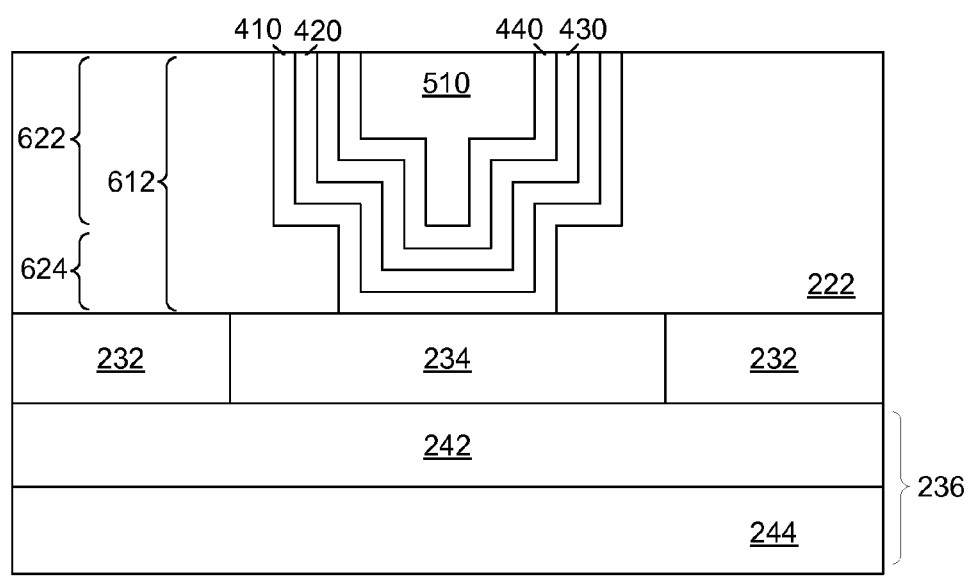
FIG. 18 shows a structure (for example, a semiconductor structure) in accordance with an embodiment of the present invention.
Figure 19:
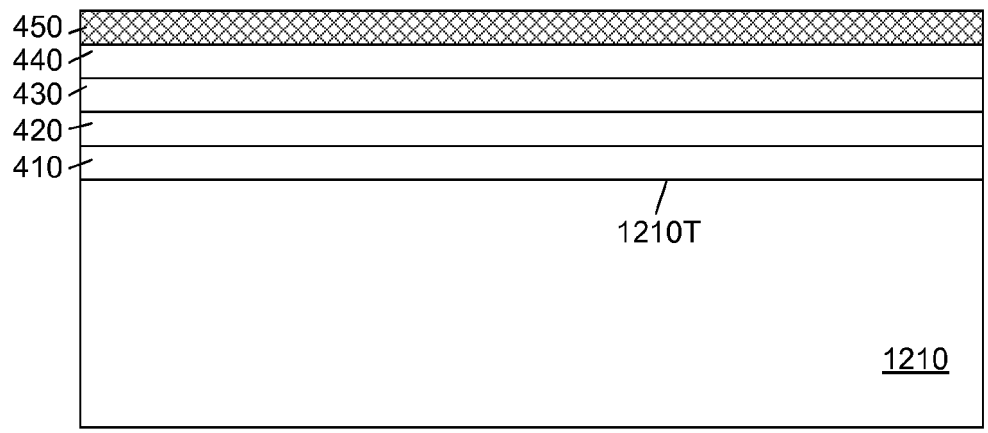
FIGS. 19 through 23 show a method of making a structure (for example, a semiconductor structure) in accordance with an embodiment of the present invention.

Referring to FIG. 18, it is seen that the layer 236 may represent a layer 242 overlying a substrate 244. As noted, the conductive layer 234 may represent a metal line of a metallization level. The layer 242 may include one or more dielectric layers and may include one or more metallization levels.

Still referring to FIG. 18, the conductive feature 612 includes an upper portion 622 overlying a lower portion 624. In one or more embodiments, the upper portion 622 may represent a metal line of a metallization level. In this case, the lower portion 624 may represent a conductive via that electrically couples the metal line 622 of a first metallization level to the metal line 234 of a second metallization level.

Still referring to FIG. 18, it is also possible that the conductive layer 234 represent a metal line of the final metallization level. In this case, it is possible that the conductive feature 612 represents a conductive pad or an under-bump metallization disposed over the metal line 234.

Still referring to FIG. 18, in one or more embodiments, the conductive layer 234 may represent a metal line of the final layer. The lower portion 624 of the conductive feature 612 may represent a conductive via while the upper portion 622 of the conductive feature 612 may present a redistribution line of a redistribution layer.

Various material layers, such as, the conductive layer 234, the first barrier layer 410, the intermediate conductive layer 420, the second barrier layer 430, the seed layer 440, the fill layer 510 as well as the second fill layer 510' have been described above. As noted above, in one or more embodiments, the conductive layer 234 may represent a metal line.

One or more of these material layers may be formed as conductive layers. Any of the conductive layers may be metallic layers. A conductive layer may include one or more conductive materials. A conductive material may be a metallic material. A metallic material may include, for example, a metal, a metallic alloy and/or a metallic compound.

In one or more embodiments, a metallic alloy may include two or more metallic elements. In one or more embodiments, a metallic alloy may include at least one metallic element and at least one non-metal element.

In one or more embodiments, the conductive material may include one or more Periodic Table elements selected from the group consisting of Cu (copper), W (tungsten), Co (cobalt), Ru (ruthenium), Ni (nickel), Au (gold), Ag (silver), Al (aluminum), Ti (titanium), Ta (tantalum), Cr (chromium), Mo (molybdenum), Pd (palladium), Pb (lead), V (vanadium), Sn (tin), N (nitrogen), and P (phosphorous). Examples of conductive materials which may be used include, but are not limited to, copper metal, copper alloy, copper compound, tungsten metal, tungsten alloy, tungsten compound, cobalt metal, cobalt alloy, cobalt compound, ruthenium metal, ruthenium alloy, ruthenium compound, nickel metal, nickel alloy, nickel compound, gold metal, gold alloy, gold compound, silver metal, silver alloy, silver compound, aluminum metal, aluminum alloy, aluminum compound, titanium metal, titanium alloy, titanium compound, tantalum metal, tantalum alloy, tantalum compound, chromium metal, chromium alloy, chromium compound, molybdenum metal, molybdenum alloy, molybdenum compound, palladium metal, palladium alloy, palladium compound, lead metal, lead alloy, lead compound, vanadium metal, vanadium alloy, vanadium compound, tin metal, tin alloy and tin compound. Further examples of conductive materials include include Ru—Ta alloy, Ti—W alloy, Ni—V alloy and Cr—Cu alloy. An additional example of a conductive material would be solder (for example, an alloy including the chemical elements (Sn) tin and (Pb) lead or a lead free solder alloy including (Sn) tin, (Ag) silver and (Cu) copper). Additional examples of conductive materials are NiMoP and CoWP. Additional examples of conductive materials include metal nitrides. Examples of metal nitrides include tantalum nitride, titanium nitride) and tungsten nitride.

In one or more embodiments, any of the layers described herein (e.g., conductive layer 234, first barrier layer 410, intermediate conductive layer 420, second barrier layer 430, seed layer 440, fill layer 510 and second fill layer 510') may comprise one or more the conductive materials described above. In some embodiments, certain conductive materials may be more useful for particular layers.

The first barrier layer 410 and/or the second barrier layer 430 may be conductive layers. The first barrier layer 410 and/or the second barrier layer 430 may be metallic layers. The first barrier layer 410 and second barrier layer 430 may have barrier and/or adhesion properties. The first barrier layer 410 and/or second barrier layer 430 may include one or more conductive materials. The first barrier layer 410 and/or second barrier layer 430 may include one or more metallic materials. Examples of metallic materials include metals, metallic alloys and metallic compounds. Examples of metallic compounds include tantalum compounds, titanium compounds and tungsten compounds. Additional examples of first barrier layer materials and/or second barrier layer materials include tantalum metal, tantalum alloy, tantalum nitride (for example, TaN), titanium metal, titanium alloy, titanium nitride, titanium tungsten, tungsten metal, tungsten alloy, tungsten nitride, ruthenium metal, ruthenium alloy, and Ru—Ta. Other examples, of barrier layer materials include chromium metal, Cr—Cu, and N—V. Combinations of materials may also be used. The first barrier layer 410 and/or the second barrier layer 430 may include a stack of two or more layers of different materials such as a tantalum metal/TaN stack, a titanium metal/TiN stack or a tungsten metal/WN stack. The first and second barrier layers may include the same materials or they may include different materials. The second barrier layer (and possibly also the first barrier layer) may include at least one material which inhibits or prevents the deposition (e.g. electroplating) of the fill layer on the second barrier layer. Examples include tantalum metal and tantalum nitride (for example, TaN).

The first barrier layer 410 and/or the second barrier layer 430 may include the chemical element Ta (tantalum). The first barrier layer and/or the second barrier layer may include a Ta-containing material. A Ta-containing material may be any material that includes the chemical element Ta (e.g. any material that includes Ta atoms in any state). This may be, for example, a tantalum metal, a tantalum alloy and/or a tantalum compound.

The first barrier layer and/or the second barrier layer may include alpha-tantalum and/or beta-tantalum. The alpha-tantalum may have a body centered cubic lattice structure. In some embodiments, the alpha-tantalum may exist as a substantially pure alpha-tantalum. A substantially pure alpha-tantalum may include impurities (e.g. trace impurities). In some embodiments, the alpha-tantalum may be a doped alpha-tantalum that may be intentionally doped with impurities (e.g. more than trace impurities). The dopant may, for example, be nitrogen. Examples of dopants include nitrogen, carbon and silicon.

In one or more embodiments, the seed layer 440 and/or the intermediate conductive layer 420 and/or the fill layer 510 and/or the second fill layer 510' may be conductive layers. In one or more embodiments, the seed layer 440 and/or the intermediate conductive layer 420 and/or the fill layer 510 and/or the second fill layer 510' may be metallic layers. The seed layer 440 and/or the intermediate conductive layer 420 and/or the fill layer 510 and/or the second fill layer 510' may comprise one or more conductive materials (such as, for example, one or more metallic materials). In one or more embodiments, the seed layer 440 and/or intermediate conductive layer 420 and/or fill layer 510 and/or the second fill layer 510' may include one or more Periodic Table chemical elements selected from the group consisting of Cu (copper), W (tungsten), Co (cobalt), Ru (ruthenium), Ni (nickel), Au (gold), Ag (silver), Al (aluminum), Ti (titanium), Ta (tantalum), Cr (chromium), Mo (molybdenum), Pd (palladium), Pb (lead), V (vanadium), Sn (tin), N (nitrogen), and P (phosphorous). The elements may exist, for example, as metals and/or metallic alloys and/or compounds (e.g. metallic compounds). The seed layer 440 and/or the intermediate conductive layer 420 and/or the fill layer 510 and/or the second fill layer 510' may include one or more conductive materials. Examples of conductive materials which may be used include, but are not limited to, copper metal, copper alloy, tungsten metal, tungsten alloy, cobalt metal, cobalt alloy, ruthenium metal, ruthenium alloy, nickel metal, nickel alloy, gold metal, gold alloy, silver metal, silver alloy, aluminum metal, aluminum alloy, titanium metal, titanium alloy, tantalum metal, tantalum alloy, chromium metal, chromium alloy, palladium metal, palladium alloy, molybdenum metal, molybdenum alloy, lead metal, lead alloy, vanadium metal, vanadium alloy, tin metal, and tin alloy.

In one or more embodiments, a copper alloy may include a doped copper.

Further examples of conductive materials include Ru—Ta alloy, Ti—W alloy, Ni—V alloy, Cr—Cu alloy, and solder (for example, an alloy including (Sn) tin and (Pb) lead or lead free solder alloy which may include (Sn) tin, (Ag) silver and (Cu) copper). Additional examples of a conductive material that may be used is NiMoP or CoWP. In addition to the materials described, the fill layer 510 and the second fill layer 510' may include any electroplatable material.

In one or more embodiments, the seed layer 440 and/or the intermediate conductive layer 420 and/or the fill layer 510 and/or the second fill layer 510' may include mixtures or combinations of different materials. In one or more embodiments, one or more of these layers may be formed as a stack of two or more sub-layers. For example, referring to FIGS. 13A,B, depending upon the application, the fill layer 510 and second fill layer 510' may be a nickel metal/gold metal stack, a nickel metal/silver metal, nickel metal/palladium metal stack, nickel metal/palladium metal/silver metal stack, nickel metal/palladium metal/gold metal stack.

Any of the dielectric layers described herein may comprise any dielectric material. Any of the dielectric layers may comprise one or more dielectric materials. The dielectric layer may comprise one or more materials selected from the group consisting of an oxide (such as silicon oxide), a nitride (such as silicon nitride), an oxynitride (such as silicon oxynitride), a carbide (such as silicon carbide) and a carbo nitride (such as silicon carbon nitride). In one or more embodiments, a mixture or combination of different materials may be used. In one or more embodiments, a dielectric layer may comprise two or more dielectric materials. For example, a dielectric layer may comprise a mixture of two or more dielectric materials. In one or more embodiments, a dielectric layer may comprise a stack of two or more sub-layers. In one or more embodiments, two or more of the sub-layers may comprise a different dielectric material.

In one or more embodiments, it is possible that dielectric material comprise a high-K dielectric material. In one or more embodiments, the high-K material may have a dielectric constant greater than that of silicon dioxide. In one or more embodiments, the high-K material may have a dielectric constant greater than about 3.9. In one or more embodiments, the high-K material may have a dielectric constant greater than that of silicon nitride. In one or more embodiments, the high-K material may have a dielectric constant greater than about 7.

In one or more embodiments, it is possible that dielectric material comprise a low-K dielectric material. In one or more embodiments, the low-K material may have a dielectric constant less than that of silicon dioxide. In one or more embodiments, the high-K material may have a dielectric constant less than 3.9.

In one or more embodiments, the first barrier layer 410 may have a thickness between about 20 nm (nanometers) and about 200 nm. In one or more embodiments, the intermediate conductive layer may have a thickness between about 50 nm and about 500 nm. In one or more embodiments, the second barrier layer may have a thickness between about 20 nm and about 200 nm. In one or more embodiments, the second seed layer 440 may have a thickness between about 50 nm and about 500 nm.

Referring to FIGS. 19 through 23, in some embodiments, it may also be possible to form layers 410, 420, 430, 440 over a workpiece 1210. For example, in one or more embodiments, the layers 410, 420, 430, 440 may be formed over (or directly on) a workpiece 1210.

The workpiece 1210 may be any workpiece. In one or more embodiments, the workpiece 1210 may have a substantially planar top surface 1210T. Hence, in one or more embodiments, the first barrier layer 410 may be formed over a surface that is substantially planar Referring to FIG. 19, a first buffer layer 410 may be formed over (or directly on) the workpiece 1210, an intermediate conductive layer 420 may be formed over (or directly on) the first buffer layer 410, a second buffer layer 430 may be formed over (or directly on) the intermediate conductive layer 420, and a seed layer 440 may be formed over (or directly on) a second buffer layer 430.

The workpiece 1210 may correspond to any workpiece. In one or more embodiments, the workpiece may (but need not) correspond to the workpiece 210 shown in FIG. 1. In some embodiments, the workpiece may correspond to the layer 224 shown in FIG. 10.

A masking layer 450 may be formed over the seed layer 440. In one or more embodiments, the masking layer 450 may be a photoresist layer.

Figure 20:
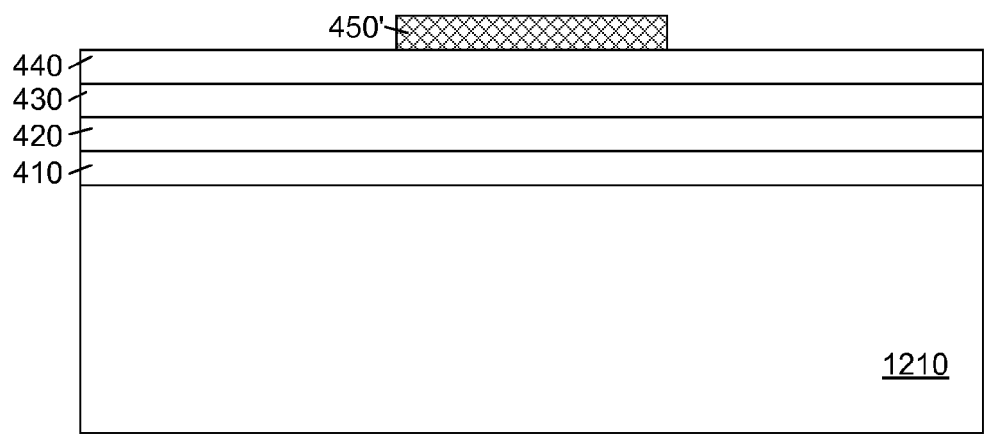
Figure 21:
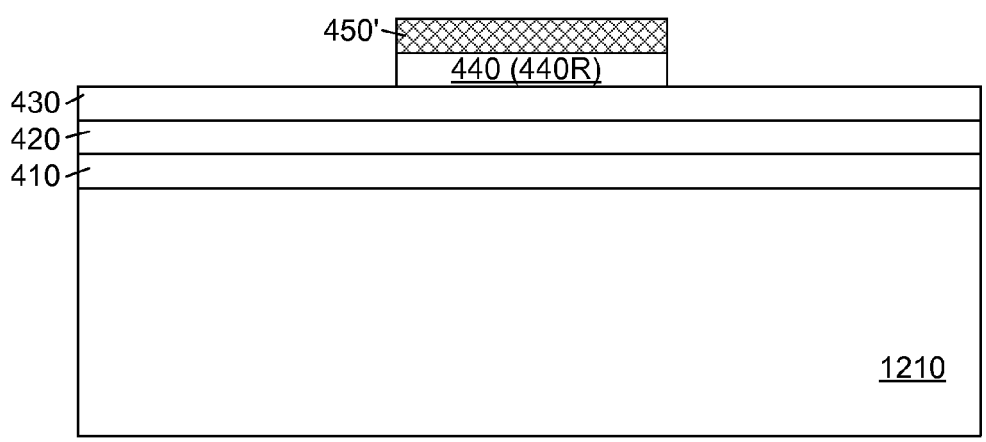
Figure 22:
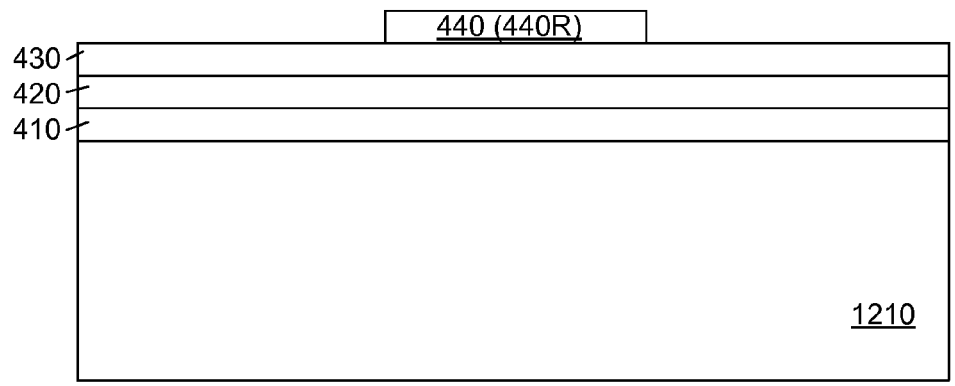

Referring to FIG. 20, the masking layer 450 may be patterned (e.g. etched) to form the portion 450' of masking layer 450. Referring to FIG. 21, using the portion 450' of masking layer 450 as a mask, the seed layer 440 may be etched. The etching process may include dry etching and/or a wet etching process. The result of the etching process may leave a remaining portion 440R of seed layer 440. Referring to FIG. 22, the portion 450' of masking layer 450 may be removed. This may expose the top surface of portion 440R of masking layer 440.

Figure 23:
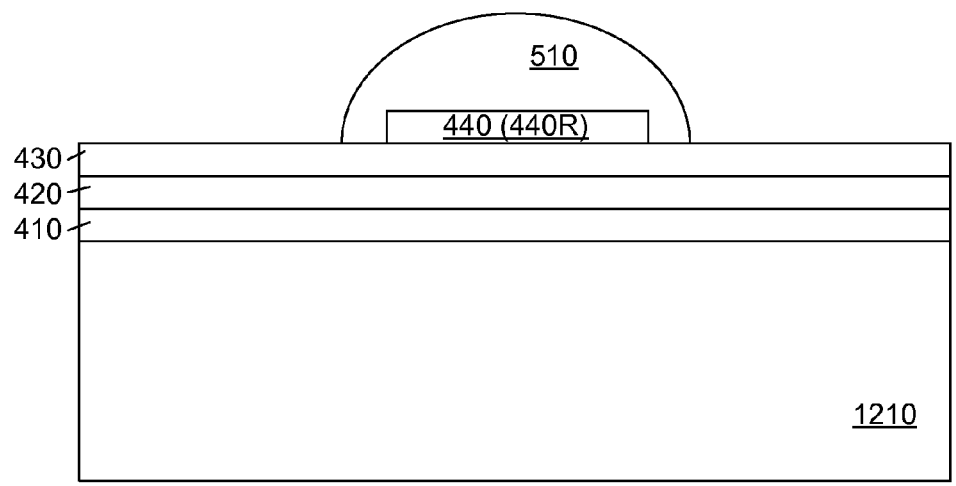

Referring to FIG. 23, a fill layer 510 may be electroplated onto the top and sidewall surfaces of the remaining portion 440R of the seed layer 440. In some embodiments, the fill layer 510 may not electroplate onto the second barrier layer 430.

In the embodiment shown in FIG. 23, the remaining portion 440R of seed layer 440 may overlie a top surface of the workpiece 210. In some embodiments, the remaining portion 440R of the seed layer 440 may be substantially planar. In some embodiments, the remaining portion 440R may be substantially parallel with an underlying substrate (e.g. a semiconductor substrate such as a silicon substrate).

The workpiece 1210 shown in FIGS. 19 through 23 may represent a homogeneous layer. For example, the workpiece may represent a dielectric layer. The workpiece 1210 may represent a substrate (such as a semiconductor substrate) or it may represent one or more layers overlying a substrate. The workpiece 1210 may represent a plurality of layer (e.g. a plurality of layer of different materials). The workpiece 1210 may represent a stack of two or more layers (e.g. of different materials).

Figure 24:
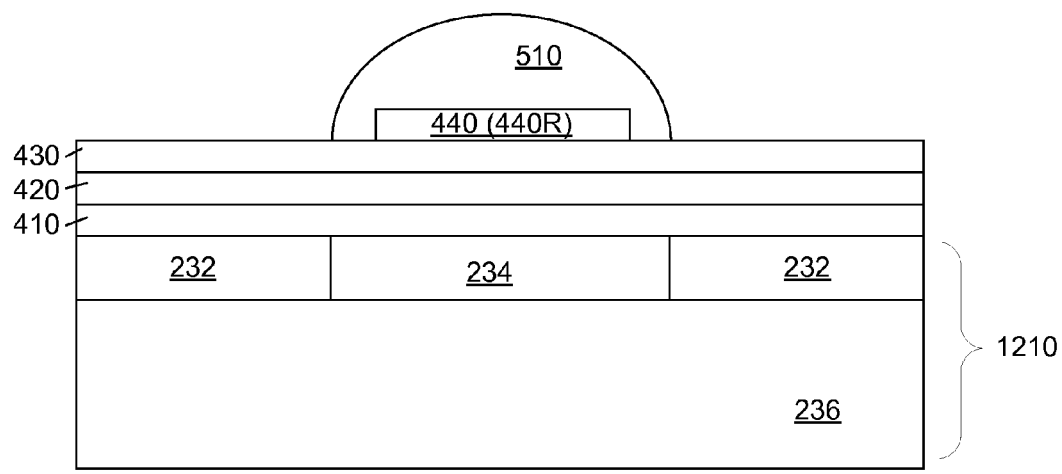
FIG. 24 shows a structure (for example, a semiconductor structure) in accordance with an embodiment of the present invention.

Referring to FIG. 24, in one or more embodiments, the workpiece 1210 may comprise a dielectric layer 232 overlying a layer 236. A conductive layer 234 may be disposed within the dielectric layer 232. The conductive layer 234 may represent a metal line of a metallization layer. In one or more embodiments, the layer 236 may represent a substrate such as a semiconductor substrate.

Figure 25:
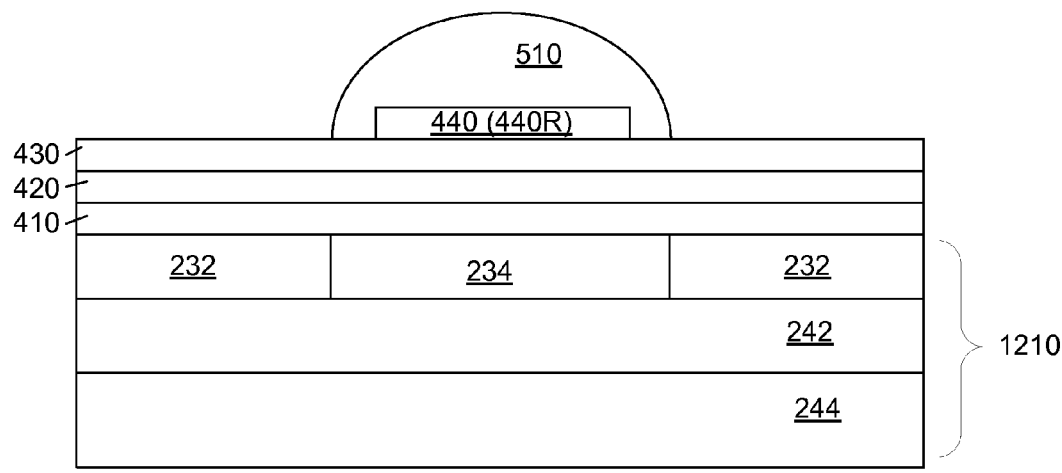
FIG. 25 shows a structure (for example, a semiconductor structure) in accordance with an embodiment of the present invention.

Referring to FIG. 25, it is seen that the layer 236 may represent a layer 242 overlying a substrate 244 (e.g. a semiconductor substrate). The layer 242 may include one or more dielectric layers and may include one or more metallization levels.

One or more embodiments relate to a method of forming an electronic device, comprising: providing a workpiece; forming a first barrier layer over the workpiece; forming an intermediate conductive layer over the first barrier layer; forming a second barrier layer over the intermediate conductive layer; forming a seed layer over the second barrier layer; removing a portion of the seed layer to leave a remaining portion of the seed layer and to expose a portion of the second barrier layer; and electroplating a fill layer on the remaining portion of the seed layer. In one or more embodiments, the electronic device may be a semiconductor device. In one or more embodiments, the electronic device may be a semiconductor structure.

One or more embodiments relate to a method of forming a semiconductor structure, comprising: providing a workpiece including an opening; forming a first barrier layer within the opening; forming an intermediate conductive layer over the first barrier layer; forming a second barrier layer over the intermediate conductive layer; forming a seed layer over the second barrier layer; removing a portion of the seed layer to leave a remaining portion, at least part of the removed portion being outside the opening, at least part of the remaining portion being within the opening; and electroplating a fill layer onto the remaining portion of the seed layer.

One or more embodiments relate to a method of forming a semiconductor structure, comprising: providing a workpiece, the workpiece including an opening; forming a first barrier layer over a bottom and sidewall surface of the opening as well as over a top surface of the workpiece; forming an intermediate conductive layer over a bottom, sidewall and top surface of the first barrier layer; forming a second barrier layer over a bottom, sidewall and top surface of the intermediate conductive layer; forming a seed layer over a bottom, a sidewall and a top surface of the second barrier layer; removing the seed layer from at least the top surface of the second barrier layer leaving a remaining portion of the seed layer overlying at least the bottom surface of the second barrier layer; and electroplating a fill layer onto the remaining portion of the seed layer.

One or more embodiments relate to a semiconductor structure, comprising: a workpiece; a first barrier layer disposed over the workpiece; an intermediate conductive layer disposed over the first barrier layer; a second barrier layer disposed over the first barrier layer; a seed layer disposed over the second barrier layer; and a fill layer disposed over the seed layer.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

What is claimed is:

1. A semiconductor structure, comprising:
   a workpiece;
   a first barrier layer disposed over said workpiece;
   an intermediate conductive layer disposed over said first barrier layer;
   a second barrier layer disposed over said first barrier layer;
   a seed layer disposed over said second barrier layer; and a fill layer disposed over said seed layer, wherein said workpiece includes an opening, said first barrier layer disposed in said opening, wherein said first barrier layer is disposed over a bottom surface and a sidewall surface of said opening, said intermediate conductive layer is disposed over a bottom and a sidewall surface of said first barrier layer, said second barrier layer disposed over a bottom and sidewall surface of said intermediate conductive layer, and said seed layer is disposed over a bottom surface and a sidewall surface of said second barrier layer, wherein said seed layer does not extend above said sidewall surface of said second barrier layer.

2. The structure of claim 1, wherein said intermediate conductive layer, said seed layer, and said fill layer are metallic layers.

3. The structure of claim 1, wherein said intermediate conductive layer and/or said seed layer and/or said fill layer include Cu (copper).

4. The structure of claim 1, wherein said first barrier layer and/or said second barrier layer comprises a Ta-containing material.

5. The structure of claim 1, wherein said opening is a single damascene opening or a dual-damascene opening.

6. The structure of claim 1, wherein said seed layer is substantially planar.

* * * * *